(12) United States Patent
Bonilla et al.

(10) Patent No.: US 8,796,133 B2
(45) Date of Patent: Aug. 5, 2014

(54) OPTIMIZATION METALLIZATION FOR PREVENTION OF DIELECTRIC CRACKING UNDER CONTROLLED COLLAPSE CHIP CONNECTIONS

(75) Inventors: Griselda Bonilla, Fishkill, NY (US); Timothy H. Daubenspeck, Colchester, VT (US); Mark C. H. Lamorey, South Burlington, VT (US); Howard S. Landis, Underhill, VT (US); Xiao Hu Liu, Briarcliff Manor, NY (US); David L. Questad, Hopewell Junction, NY (US); Thomas M. Shaw, Peekskill, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/553,941

(22) Filed: Jul. 20, 2012

(65) Prior Publication Data

US 2014/0021622 A1    Jan. 23, 2014

(51) Int. Cl.
*H01L 21/44* (2006.01)
*H01L 23/48* (2006.01)
(52) U.S. Cl.
USPC ........... 438/614; 438/612; 438/618; 257/773; 257/780; 257/781; 257/784; 257/E21.575; 257/E23.169
(58) Field of Classification Search
USPC .......... 257/737, 738, 780, 781, 784, E23.021, 257/E23.069, 750, 758, 773, E23.169, 257/E21.575, E23.011; 438/612–618
See application file for complete search history.

(56) References Cited

U.S. PATENT DOCUMENTS

| | | | |
|---|---|---|---|
| 4,604,644 A * | 8/1986 | Beckham et al. | 257/737 |
| 5,814,401 A | 9/1998 | Gamota et al. | |
| 6,365,441 B1 | 4/2002 | Raiser et al. | |
| 6,399,896 B1 | 6/2002 | Downes, Jr. et al. | |
| 6,559,548 B1 * | 5/2003 | Matsunaga et al. | 257/774 |
| 6,566,244 B1 | 5/2003 | May et al. | |
| 6,667,557 B2 | 12/2003 | Alcoe et al. | |
| 6,946,742 B2 | 9/2005 | Karpman | |
| 7,071,559 B2 | 7/2006 | Awad et al. | |
| 7,489,038 B2 | 2/2009 | Awad et al. | |
| 7,498,198 B2 | 3/2009 | Charles et al. | |
| 7,531,900 B2 | 5/2009 | Lin et al. | |
| 7,666,712 B2 | 2/2010 | Awad et al. | |
| 7,985,671 B2 | 7/2011 | Daubenspeck et al. | |
| 2007/0132107 A1 | 6/2007 | Wu | |
| 2007/0178627 A1 | 8/2007 | Jiang et al. | |
| 2008/0237855 A1 | 10/2008 | Fan et al. | |
| 2008/0268579 A1 | 10/2008 | Yu et al. | |
| 2011/0163444 A1 | 7/2011 | Hayashi | |

OTHER PUBLICATIONS

Chan, et al., "Effect of Underfill Entrapment on the Reliability of Flip-Chip Solder Joint," Journal of Electronic Packaging, Transactions of the ASME, Dec. 2004, vol. 126, pp. 541-545.

* cited by examiner

*Primary Examiner* — Jasmine Clark
(74) *Attorney, Agent, or Firm* — Gibb & Riley, LLC; David A. Cain, Esq.

(57) ABSTRACT

A method of reducing white bump formation and dielectric cracking under controlled collapse chip connections (C4s). The method comprises fabricating a substrate having a plurality of metallization layers, one or more of the layers is of low k dielectric material. The substrate includes a plurality of attachment pads for the C4s. The fabricating comprises selectively forming at least a portion of the substrate with metal fill having a higher Young's modulus of elasticity than any of the one or more layers of low k dielectric material in portions of the substrate located beneath at least some of the attachment pads.

24 Claims, 7 Drawing Sheets

OPTIMIZATION METALLIZATION FOR PREVENTION OF DIELECTRIC CRACKING UNDER CONTROLLED COLLAPSE CHIP CONNECTIONS

BACKGROUND

The present disclosure relates to microelectronic packaging of semiconductor chips and, more specifically, to the process of manufacturing IC flip chip assemblies designed to reduce the structural damage to controlled collapse chip connection, also known as "C4", connections.

Advances in microelectronics technology tend to develop chips that occupy less physical space while performing more electronic functions. Conventionally, each chip is packaged for use in housings that protect the chip from its environment and provide input/output communication between the chip and external circuitry through sockets or solder connections to a circuit board or the like. Miniaturization results in generating more heat in less physical space, with less structure for transferring heat from the package.

The heat of concern is derived from wiring resistance and active components switching. The temperature of the chip and substrate rises each time the device is turned on and falls each time the device is turned off. As the chip and the substrate ordinarily are formed from different materials having different coefficients of thermal expansion (CTE), the chip and structure tend to expand and contract by different amounts, a phenomenon known as CTE mismatch. This causes the electrical contacts on the chip to move relative to the electrical contact pads on the substrate as the temperature of the chip and substrate changes. This relative movement deforms the electrical interconnections between the chip and the printed wiring board (PWB), and places them under mechanical stress. These stresses are applied repeatedly with repeated operation of the device, and can cause fatigue of the electrical interconnections. This is especially true for the solder ball of the controlled collapse chip connection (C4).

Conventional techniques for protecting structures on semiconductor chips include using low dielectric potential (k) interlevel dielectric (ILD) materials (e.g., spin-on-glass (SOG), Hydrogensilsesquioxane (HSQ), Methylisilane (MSQ), Benzocyclobutene (BCB), etc.) for input/output (I/O) and mechanical support structures that are applied to a previously fabricated semiconductor chip. Such I/O and support structures are formed after the logical function sections of the semiconductor chip have been completed. Therefore, such structures/processing are sometimes referred to as "back end of line" (BEOL) structures/processing because they are formed at the back end of the production line.

However, many low k materials are soft as compared to silicon dioxide and, when bonding forces are applied; the low k materials can be easily damaged. There are two main approaches to chip joining: C4 solder balls and wire bonding. In C4 joining, the forces applied during the formation of the solder ball connections, can damage the low k dielectric materials. In wire bonding, the damage from ultrasonic energy, capillary pressure, and temperature can weaken or collapse the low k insulator. Furthermore, the mechanical stresses associated with structures below the solder ball connections are such that a significant build up of stresses may result in material failure, fatigue, and eventual device breakdown. Cracking and other connection failures typically occur during chip-join, cool-down, or during subsequent handling of the flip chip package, before an underfill is introduced between the chip and package to distribute stresses across the chip/package interface more uniformly. The phenomena where cracking under the C4s occurs so as to cause the C4 sites to be highlighted in ultrasonic inspection images as white spots is sometimes referred to as "white bumps".

The stress and strain of a given material are directly proportional to one another and the proportionality defines the modulus of elasticity of the material. Young's modulus (E) describes tensile elasticity, or the tendency of an object to deform along an axis when opposing forces are applied along that axis; it is defined as the ratio of tensile stress to tensile strain, and is often referred to simply as the elastic modulus.

Empirical data and finite element modeling shows that the dielectric under C4s is more likely to crack during chip joining (white bump formation) when the effective modulus of the dielectric layers under the C4 is lower. The effective modulus of the BEOL stack depends on the modulus of the dielectric layers in the stack and the amount and arrangement of the metallization in the stack. As the modulus of the metal features is typically much higher than that of the dielectric, the effective modulus of the stack can be increased by increasing the metal density. Several configurations of the metal have been previously identified as being particularly favorable for increasing the effective modulus of the stack. These include using stacked via structures as pillar like supports and using high densities of via structures connecting metal lines and pads. Several schemes have been devised to fill blank spaces in a chip design so as to improve the stiffness of the BEOL stack. The focus of these schemes has typically been on providing a uniform overall metal density so as to enable uniform polishing of the metal structures during the CMP processing used to form Damascene interconnect structures. Approaches used include using fine square and rectangular fill shapes, filling using multiple passes with different patterns, and connecting fill shapes with via structures.

The industry has long sought to incorporate protective structures over the semiconductor chip, or selective portions thereof, to minimize the impact of these forces on the chip structures. While techniques have been developed to avoid failure in the fill material (low k material) during manufacture, active chip devices should be shielded from mechanical stresses, especially below the solder ball connections, where significant forces are applied resulting in increased mechanical stresses in those areas.

SUMMARY

According to one embodiment herein, a method of reducing white bump formation and dielectric cracking under controlled collapse chip connections (C4) is disclosed. The method comprises fabricating a substrate having a plurality of metallization layers, one or more of the layers is of low k dielectric material. The substrate includes a plurality of attachment pads for the C4s. The fabricating comprises selectively forming at least a portion of the substrate with metal fill having a higher Young's modulus of elasticity than any of the one or more layers of low k dielectric material in portions of the substrate located beneath at least some of the attachment pads.

According to another embodiment herein, a method of reducing white bump formation and dielectric cracking under controlled collapse chip connections (C4s) is disclosed. The method comprises fabricating a substrate having a plurality of metallization layers, one or more of the layers being of low k dielectric material. The substrate includes a plurality of attachment pads for the C4s. The fabricating comprising selectively forming at least a portion of the substrate with metal fill having a higher Young's modulus of elasticity than any of the one or more layers of low k dielectric material in portions of the substrate located beneath at least some of the attachment pads, and selectively forming at least a portion of the substrate to optimize performance.

According to another embodiment herein, a method of reducing white bump formation and dielectric cracking under controlled collapse chip connections (C4s) is disclosed. The method comprises fabricating a substrate having a plurality of metallization layers, one or more of the layers being of low k dielectric material. The substrate has a peripheral edge and a center. The fabricating comprising selectively forming at least a portion of the substrate with metal fill having a higher Young's modulus of elasticity than any of the one or more layers of low k dielectric material in portions of the substrate around the peripheral edge of the substrate and at least partly from the edge toward the center of the substrate.

According to another embodiment herein, a semiconductor product is disclosed. The semiconductor product comprises an integrated circuit chip substrate and an interconnection layer formed between the integrated circuit chip substrate and a package. The interconnection layer comprises a plurality of controlled collapse chip connections (C4s) and an underfill material. The integrated circuit chip substrate comprises a plurality of attachment pads on a top surface thereof, and a plurality of metallization layers. One or more of the layers is of low k dielectric material. A portion of the substrate located beneath at least some of the attachment pads comprises metal fill having a higher Young's modulus of elasticity than any of the one or more layers of low k dielectric material.

BRIEF DESCRIPTION OF THE DRAWINGS

The embodiments herein will be better understood from the following detailed description with reference to the drawings, which are not necessarily drawing to scale and in which.

DETAILED DESCRIPTION

One of the difficulties with adding additional fill shapes to a design is that it increases the capacitive load on signal lines, delaying signal propagation and increasing power dissipation. For this reason, structures that maximize the effective modulus are frequently avoided. The process disclosed herein applies an enhanced filling strategy that maximizes the effective modulus of the BEOL stack in selective areas of the chip that are critical to white bump formation and applies an optimum filling strategy to fill structures for performance in areas that are not critical for dielectric cracking and white bump formation. The embodiments described herein mainly concern C4 joining; however, a similar approach could be applied to wire bonding by selectively reinforcing areas under wire bond pads.

In a first process, the modulus enhanced fill is applied under and around individual C4 sites. In many cases, the enhance fill may be applied only on one side of the C4, such as the side that experiences tensile loading during chip joining. In a second process, the modulus enhanced fill is applied selectively to areas of the chip that experience the maximum stresses on the C4s, such as areas that have a high distance from the neutral point. Typically, this is in the corners or along the edges of a rectangular chip, although additional sites may need to be reinforced in designs that are more complicated.

As mentioned above, conventional techniques for protecting structures on semiconductor chips include using low dielectric potential (k) interlevel dielectric (ILD) materials for input/output (I/O) and mechanical support structures that are applied to a previously fabricated semiconductor chip. Such I/O and support structures are formed after the logical function sections of the semiconductor chip have been completed. The systems and methods herein address these issues by disclosing a process that judiciously uses metal fill shapes at white-bump sensitive locations on the chip side of a chip package module to provide a localized modulus increase. The fill shapes can be employed primarily at C4 locations or at chip-edge low-modulus locations that are known to be sensitive to white bumps. The metal fill shapes are used selectively—only where needed—to instill cracking resistance, without an attendant increase in capacitive load on signal lines that may delay signal propagation or increase power dissipation.

Figure 1:
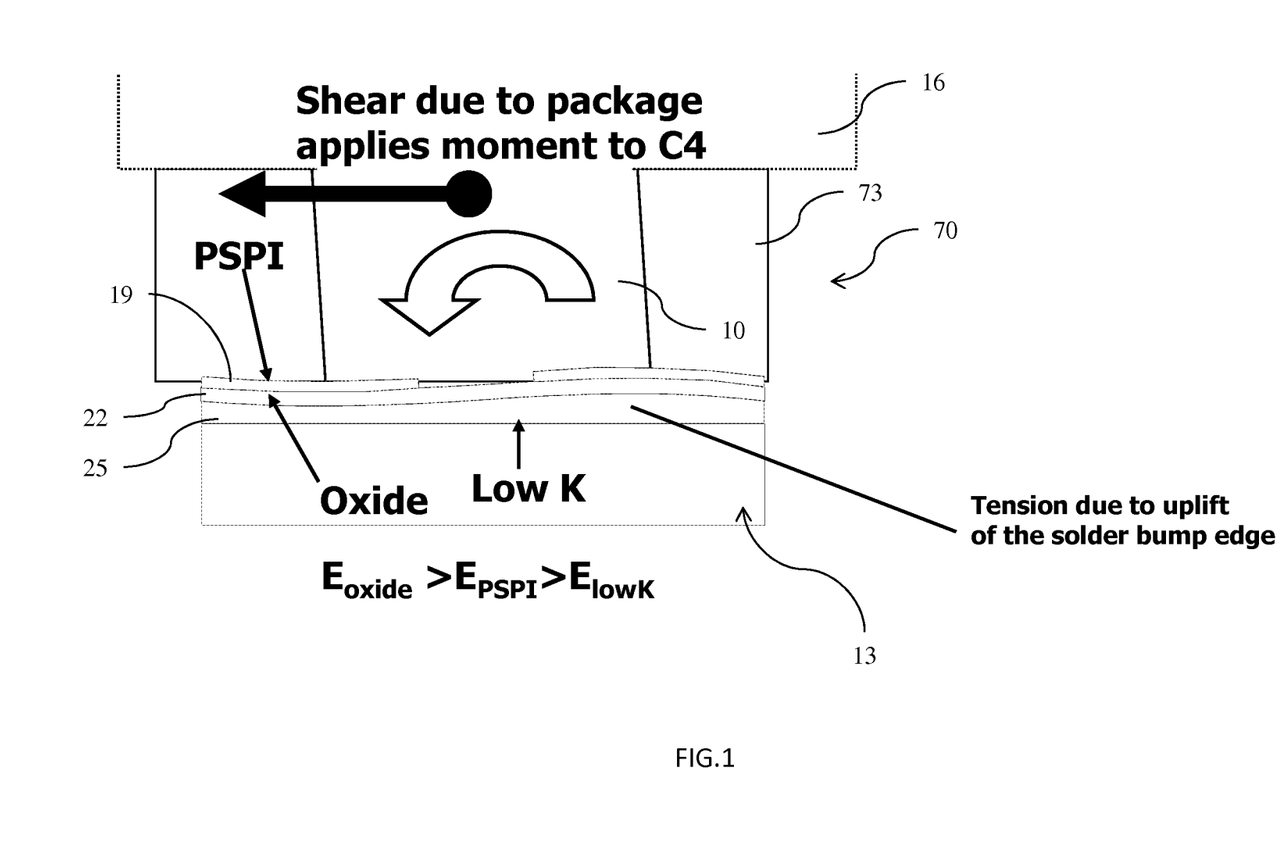
FIG. 1 is a sectional view of a C4 in a semiconductor.

FIG. 1 illustrates a controlled collapse chip connection (C4) 10 between an integrated chip substrate 13 and a package 16. The substrate 13 includes several layers such as a photosensitive polyimide (PSPI) layer 19 and a stiff upper oxide layer 22 that sit on a soft elastic foundation of one or more layers of low k dielectric material 25. Each layer has its own modulus of elasticity, E. In the illustrated example, the modulus of elasticity ($E_{oxide}$) for the stiff upper oxide layer 22 is greater than the modulus of elasticity ($E_{PSPI}$) of the PSPI layer 19, which modulus of elasticity is greater than the modulus of elasticity ($E_{lowK}$) for the layers of low k dielectric material 25. In order to mount the chip to external circuitry (e.g., a circuit board or another chip or wafer), it is flipped over, so that its top side faces down, and aligned, so that its pads align with matching pads on the external circuit, and then the solder is flowed to complete the interconnect. During flip chip assembly, the package 16 applies a shear moment to the C4 10 such that at least a portion of the substrate 13 is under tension due to uplift of the solder bump edge. Such shear moment can result in damage to the C4 10 and loss of integrity of the flip chip. A more stiff structure, that is, one with a higher modulus of elasticity, is less susceptible to damage during flip chip assembly.

Figure 2:
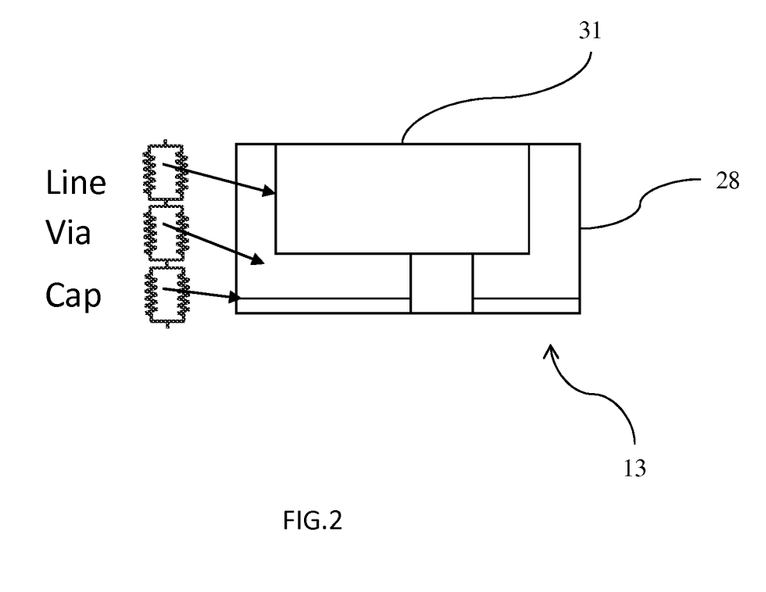
FIG. 2 is a schematic example of a substrate via.

Referring to FIG. 2, various configurations of the substrate have been previously identified as being particularly favorable for increasing the effective modulus of the substrate 13. These include using stacked via structures 28 as pillar like supports and using high densities of via structures with metal connecting lines 31 and pads. One of the difficulties with adding additional fill shapes to a design is that it increases that capacitive load on signal lines. Therefore, structures that maximize the effective modulus are frequently avoided.

Figure 3:
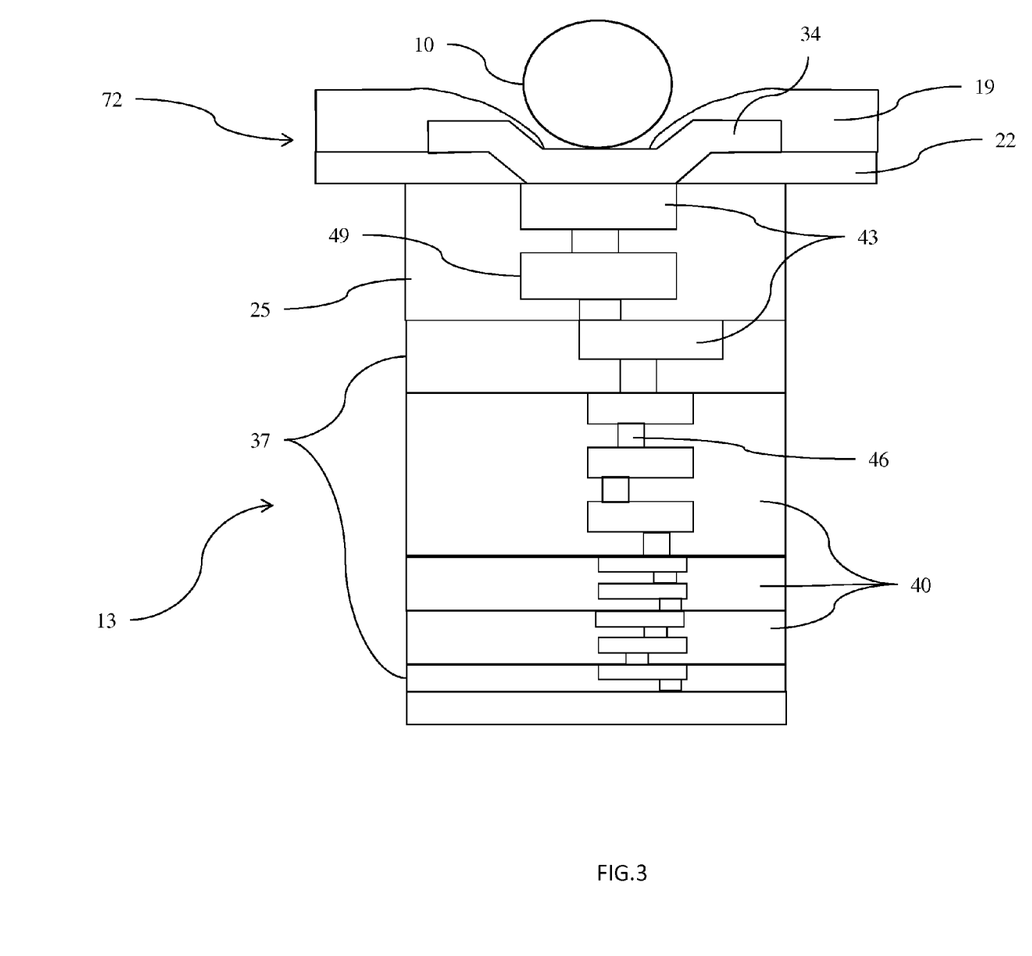
FIG. 3 is a block diagram illustrating metallization layers in a substrate.

FIG. 3 shows a plurality of metallization layers in a substrate 13. The various layers may include conductors and/or insulators, according to the intended purpose of the chip. The layers may include an attachment pad 34 for connection to a C4 10. Other layers may include one or more layers of low k dielectric material 25, one or more silicon based material layers 37, and several other dielectric layers 40, according to the intended purpose of the chip. Within the layers may be a plurality of metal connectors 43, metal vias 46, and metal fills 49, according to the intended purpose of the chip. The effective modulus of a stack of dielectrics, as they are arranged vertically in the chip (normal to the substrate), is dependent upon the modulus of each layer, which is dependent upon the modulus of the material, the metal density in via and line levels, and the thickness of the layer, among other things.

The effective modulus of a stack can be enhanced by a multitude of techniques, such as through metal fill, or by fill shaping, such as alternating the fill shapes in the power distribution network. Other methods may include using a metal of increased density or increasing the density of the vias. Increasing fill or via densities is one way of enhancing the modulus. However, it also matters how these features are arranged. One method may be to stack the vias so that they are vertically arranged in the chip so as to be aligned directly above each other, which increases the modulus of the dielectric stack normal to the substrate. It must always be considered that enhanced fill often results in a trade off with electrical performance of the chip.

According to an embodiment herein, a filling strategy that maximizes the effective modulus of the dielectric stack is applied in selective areas of the chip that are critical to white bump formation. In areas of the chip that are not critical for dielectric cracking and white bump formation, a filling strategy that is optimized for performance of the chip is applied.

Figure 4:
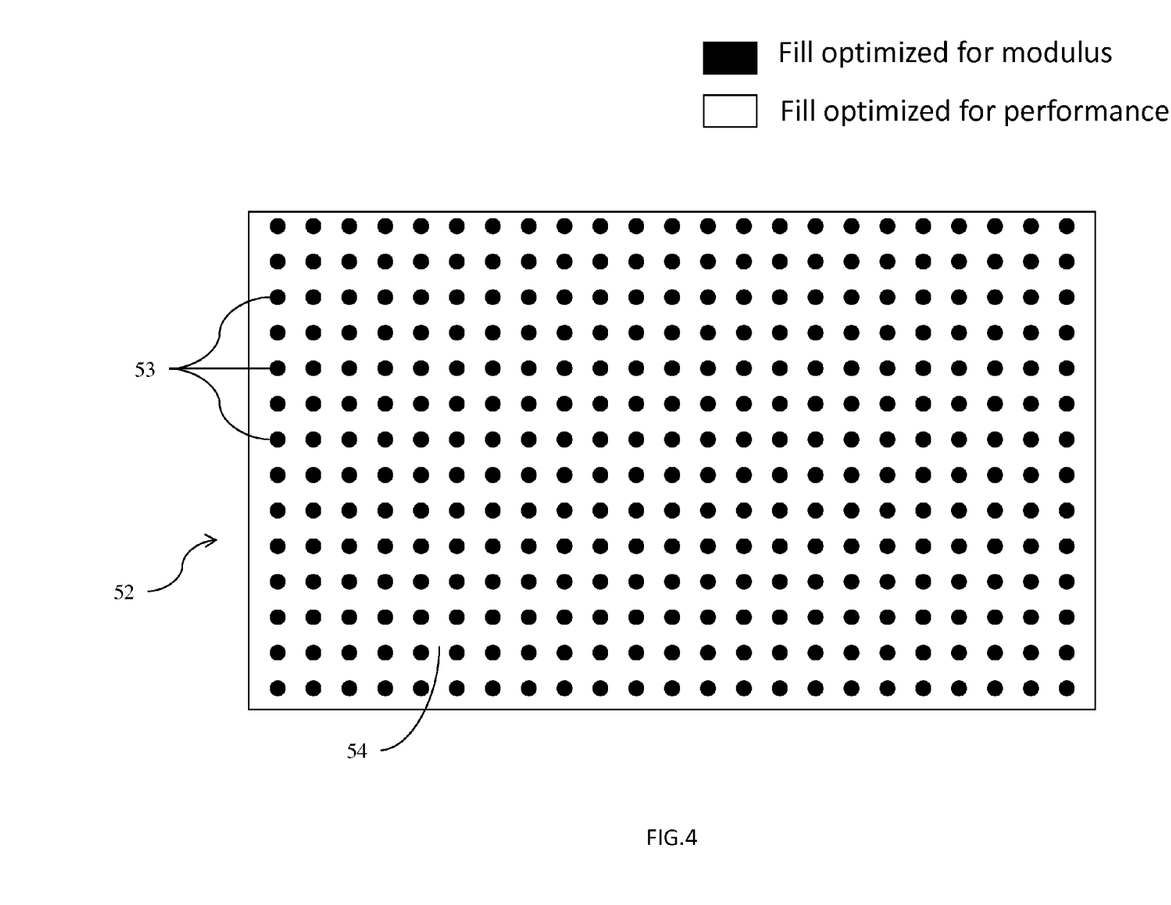
FIG. 4 is an enhancement diagram illustrating embodiments herein.

Referring to FIG. 4, one exemplary embodiment herein shows an integrated circuit chip 52. Modulus enhanced fill is applied under individual C4 sites, such as indicated at 53, throughout the chip 52. The remainder of the chip, such as shown at 54, has fill optimized for performance of the chip 52.

According to this embodiment, a method of reducing white bump formation and dielectric cracking under the C4 10 comprises fabricating a substrate 13 (such as shown in FIG. 3) having a plurality of metallization layers, one or more of the layers being of low k dielectric material 25. The chip 52 includes a plurality of attachment pads 34 for the C4s 10. In fabricating the chip 52, at least a portion of the substrate 13 is selectively formed with metal fill having a higher Young's modulus of elasticity than any of the one or more layers of low k dielectric material 25 in portions 53 of the chip located beneath at least some of the attachment pads 34.

Figure 5:
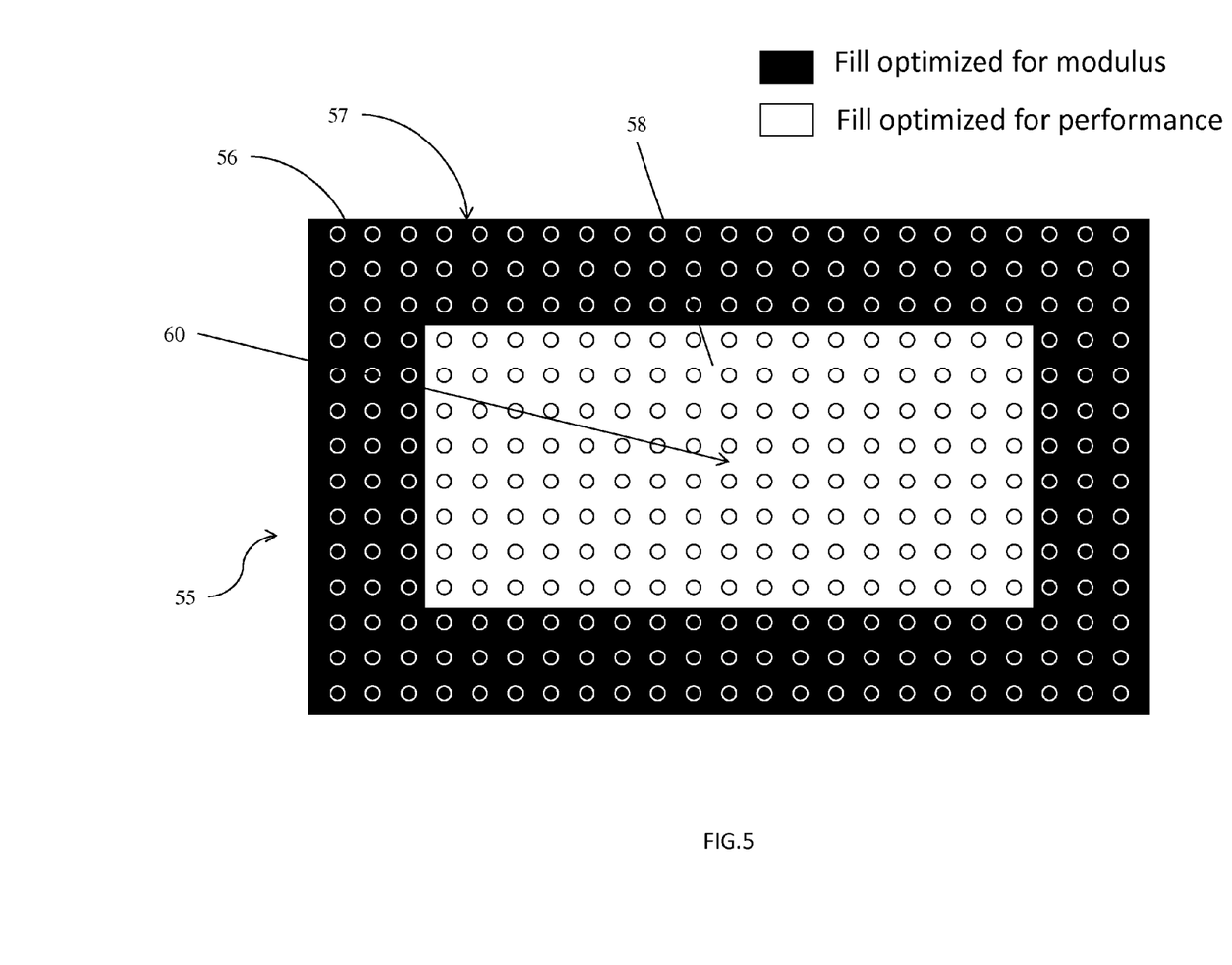
FIG. 5 is an enhancement diagram illustrating embodiments herein.

Referring to FIG. 5, another exemplary embodiment herein shows an integrated circuit chip 55 where the modulus enhanced fill is applied in areas of the chip that would have high stress, indicated as 56, around the periphery of the chip 55. The remainder of the chip, such as shown at 58, has fill optimized for performance of the chip 55.

According to this embodiment, a method of reducing white bump formation and dielectric cracking under the C4 10 comprises fabricating a substrate 13 (such as shown in FIG. 3) having a plurality of metallization layers, one or more of the layers being of low k dielectric material 25. The chip 55 has a peripheral edge 57 and a point of neutral stress 60. The chip 55 may also include a plurality of attachment pads 34 for the C4s 10. In fabricating the chip 55, at least a portion of the substrate 13 is selectively formed with metal fill having a higher Young's modulus of elasticity than any of the one or more layers of low k dielectric material 25 in portions 56 of the chip around the peripheral edge 57 of the chip 55 and at least partly from the peripheral edge 57 toward the point of neutral stress 60 of the chip 55.

Figure 6:
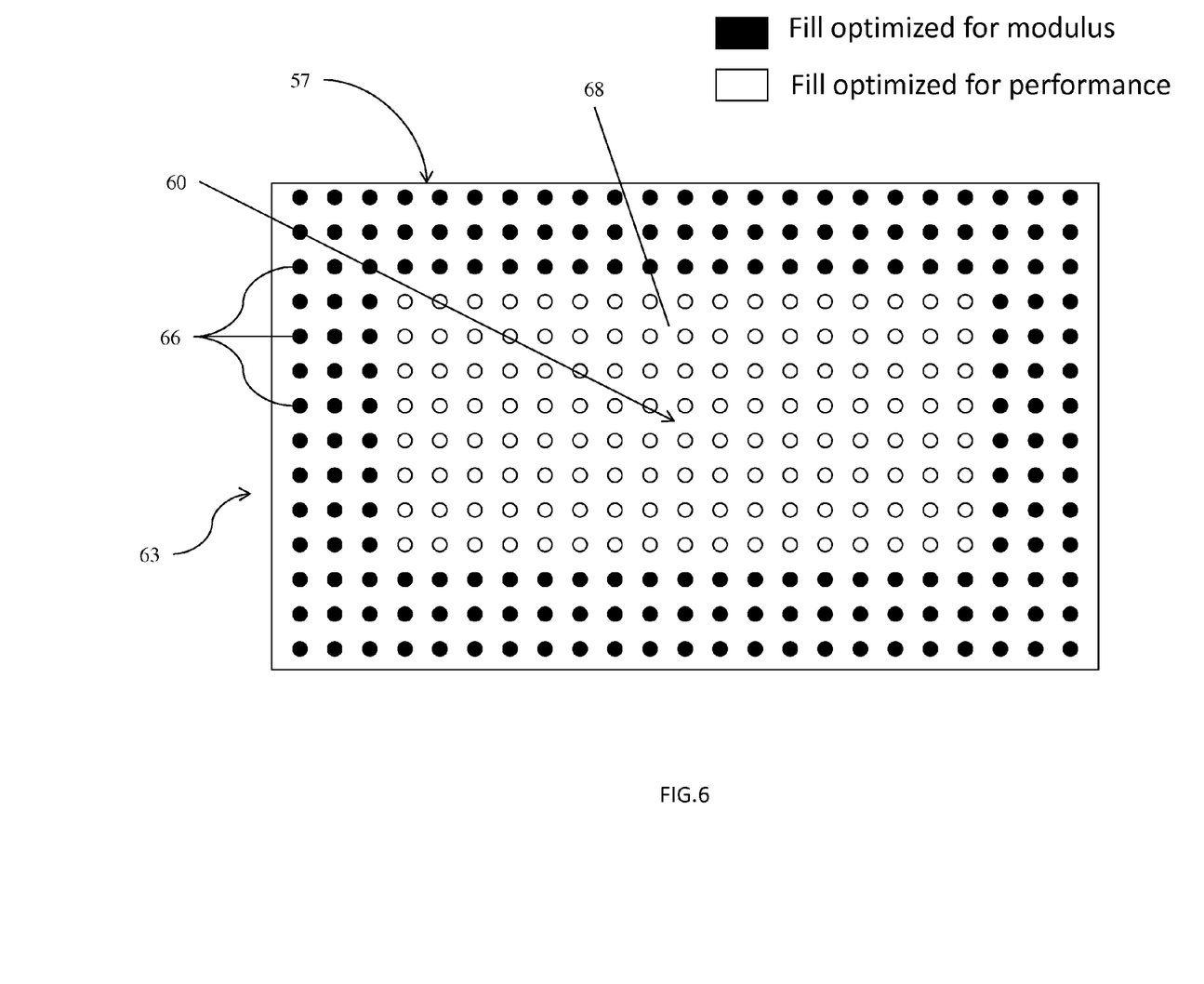
FIG. 6 is an enhancement diagram illustrating embodiments herein.

Referring to FIG. 6, another exemplary embodiment herein shows an integrated circuit chip 63 where the modulus enhanced fill is applied under individual C4 sites, such as indicated at 66, around the periphery of the chip 63. The remainder of the chip 63, such as shown at 68, has fill optimized for performance of the chip 63.

According to this embodiment, a method of reducing white bump formation and dielectric cracking under the C4 10 comprises fabricating a substrate 13 (such as shown in FIG. 3) having a plurality of metallization layers, one or more of the layers being of low k dielectric material 25. The chip 63 has a peripheral edge 57 and a point of neutral stress 60. The chip 63 may also include a plurality of attachment pads 34 for the C4s 10. In fabricating the chip 63, at least a portion of the substrate 13 is selectively formed with metal fill having a higher Young's modulus of elasticity than any of the one or more layers of low k dielectric material 25 in portions 66 of the chip 63 located beneath the attachment pads 34 around the peripheral edge 57 of the chip 63 and at least partly from the peripheral edge 57 toward the point of neutral stress 60 of the chip 63.

The examples shown in FIGS. 4-6 are described with reference to a rectangular chip. The concepts described herein may also be applied to chips having different shapes. Furthermore, it may be adequate in many cases to apply the enhance fill only on one side of the C4 such as the side that experiences tensile loading during chip joining. In some cases, the enhanced fill is applied selectively to the areas of the chip that experience the maximum stresses on the C4s, such as areas that have a high distance from a neutral stress point. Typically, this is in the corners or along the edges of a rectangular chip, although additional sites may need to be reinforced in designs that are more complicated.

Referring again to FIG. 1, the semiconductor product disclosed herein comprises an integrated circuit chip substrate 13 and an interconnection layer 70 formed between the substrate 13 and a package 16. The interconnection layer 70 comprises a plurality of controlled collapse chip connections (C4s) 10 and an underfill material 73. The substrate 13 of the integrated circuit chip 52, 55, 63 comprises a plurality of attachment pads 34 on a top surface 72 thereof, and a plurality of metallization layers 19, 22, 25, 37, 40, 43 (see FIG. 3). One or more of the layers is of low k dielectric material. A portion of the substrate located beneath at least some of the attachment pads 34 comprises metal fill having a higher Young's modulus of elasticity than any of the one or more layers of low k dielectric material 25, 40.

Figure 7:
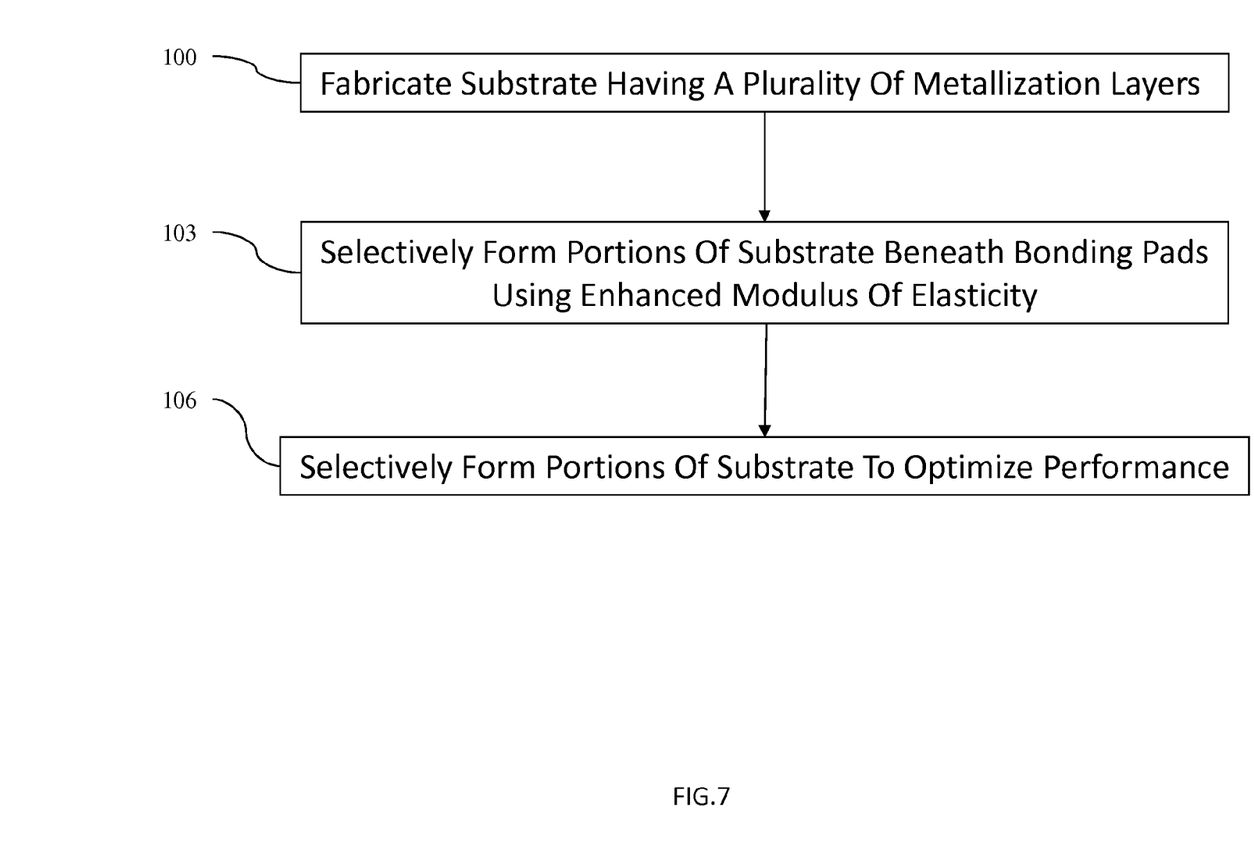
FIG. 7 a flow diagram illustrating embodiments herein.

An exemplary embodiment of the method of reducing white bump formation and dielectric cracking under controlled collapse chip connections described herein is illustrated in FIG. 7. First, at 100, a substrate having a plurality of metallization layers is fabricated. One or more of the layers is of low k dielectric material and the substrate includes a plurality of attachment pads for the C4s. At 103, at least a portion of the substrate is selectively formed with metal fill having a higher Young's modulus of elasticity than any of the one or more layers of low k dielectric material in portions of the substrate located beneath at least some of the attachment pads. At 106, at least a portion of the substrate is formed to optimize performance.

The flowchart and block diagrams in the Figures illustrate the architecture, functionality, and operation of possible implementations of the methods and semiconductor products according to various embodiments herein. In this regard, each block in the flowchart or block diagrams may represent a module or segment, which comprises one or more executable instructions for implementing the specified function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   fabricating a multi-layer chip in a process comprising:
      selectively forming a first portion of said multi-layer chip comprising a first stack of layers completely through the thickness thereof, said first stack of layers having a first modulus of elasticity; and
      selectively forming a second portion of said multi-layer chip alongside said first portion, said second portion comprising a second stack of layers completely through the thickness thereof and having a second modulus of elasticity different from said first modulus of elasticity;
   forming a dielectric layer on said first stack of layers and said second stack of layers; and
   forming attachment pads in said dielectric layer.

2. The method according to claim 1, said first portion located beneath at least some of said attachment pads having an effective modulus that is greater than an effective modulus for said second portion elsewhere in said chip.

3. The method according to claim 1, said first portion having enhanced fill by at least one of increasing metal fill density and increasing density of vias.

4. The method according to claim 1, said dielectric formed on said first portion and said second portion comprising low k dielectric material, said method further comprising:
   selectively forming at least some of said multi-layer chip with metal fill having a higher Young's modulus of elasticity than at least one metallization layer of said multi-layer chip comprising low k dielectric material.

5. The method according to claim 1, said first modulus of elasticity being greater than said second modulus of elasticity.

6. The method according to claim 2, said at least some of said attachment pads being located around a periphery of said multi-layer chip.

7. The method according to claim 1, further comprising:
   selectively forming said first portion of said multi-layer chip around a peripheral edge of said multi-layer chip and at least partly from said peripheral edge toward a position of neutral stress of said multi-layer chip.

8. A method comprising:
   fabricating a multi-layer chip having a plurality of metallization layers, in a process comprising:
      selectively forming first portions of said multi-layer chip comprising first stacks of layers completely through the thickness thereof, said first stacks of layers having a first modulus of elasticity; and
      selectively forming second portions of said multi-layer chip alongside said first portions, said second portions comprising second stacks of layers completely through the thickness thereof and having a second modulus of elasticity different from said first modulus of elasticity;

forming a dielectric layer on said first portions and said second portions; and forming attachment pads in said dielectric layer said plurality of metallization layers comprising at least one layer comprising a metal pattern and at least one layer comprising low k dielectric material.

9. The method according to claim 8, said first portions located beneath at least some of said attachment pads having an effective modulus that is greater than an effective modulus for said second portions elsewhere in said multi-layer chip.

10. The method according to claim 8, said first portions having an enhanced modulus being enhanced by at least one of increasing metal fill density and increasing density of vias.

11. The method according to claim 8, further comprising:

selectively forming at least some of said multi-layer chip with metal fill having a higher Young's modulus of elasticity than said at least one layer comprising low k dielectric material.

12. The method according to claim 9, said at least some of said first portions being located around a periphery of said multi-layer chip.

13. The method according to claim 8, further comprising:

selectively forming said first portions of said multi-layer chip around a peripheral edge of said multi-layer chip and at least partly from said peripheral edge toward a position of neutral stress of said multi-layer chip.

14. The method according to claim 8, said first modulus of elasticity being greater than said second modulus of elasticity.

15. A multi-layer chip comprising:

a first portion comprising a first stack of layers completely through the thickness thereof, said first stack of layers having a first modulus of elasticity;

a second portion alongside said first portion, said second portion comprising a second stack of layers completely through the thickness thereof and having a second modulus of elasticity different from said first modulus of elasticity;

a dielectric layer on said first portion and said second portion; and attachment pads above said first portion and said second portion in said dielectric layer.

16. The multi-layer chip according to claim 15, areas of said first portion located beneath at least some of said attachment pads having an effective modulus that is greater than an effective modulus for areas of said second portion located elsewhere in said multi-layer chip.

17. The multi-layer chip according to claim 15, said first portion having an enhanced modulus being enhanced by at least one of increasing metal fill density and increasing density of vias.

18. The multi-layer chip according to claim 15, further comprising:

a plurality of metallization layers comprising at least one layer comprising a metal pattern and at least one layer comprising low k dielectric material.

19. The multi-layer chip according to claim 18, at least some of said multi-layer chip comprising fill having a higher Young's modulus of elasticity than said at least one layer comprising low k dielectric material.

20. The multi-layer chip according to claim 15, said at least some of said attachment pads being located around a periphery of said multi-layer chip.

21. A semiconductor product comprising:

an integrated circuit chip substrate;

an interconnection layer formed between said integrated circuit chip substrate and a package, said interconnection layer comprising a plurality of controlled collapse chip connections and an underfill material;

said integrated circuit chip substrate comprising:

a plurality of first portions comprising first stacks of layers completely through the thickness thereof, said first stacks of layers having a first modulus of elasticity;

a plurality of second portions alongside said first portions, said second portions comprising second stacks of layers completely through the thickness thereof and having a second modulus of elasticity different from said first modulus of elasticity; and a dielectric layer on said first portions and said second portions; and a plurality of attachment pads in said dielectric layer, and a plurality of controlled collapse chip connections on said attachment pads.

22. The semiconductor product according to claim 21, areas of said first portions of said integrated circuit chip substrate located beneath at least some of said attachment pads having an effective modulus that is greater than an effective modulus for areas of said second portions of said substrate located elsewhere in said substrate.

23. The semiconductor product according to claim 21, said first portions having an enhanced modulus being enhanced by at least one of increasing metal fill density and increasing density of vias.

24. The semiconductor product according to claim 21, said first portions of said integrated circuit chip substrate being located around a peripheral edge of said integrated circuit chip substrate and at least partly from said peripheral edge toward a position of neutral stress of said integrated circuit chip substrate.

* * * * *